United States Patent
Sakai et al.

(10) Patent No.: US 8,723,038 B2
(45) Date of Patent: May 13, 2014

(54) PLATE METAL MEMBER, BUS BAR, AND ELECTRICAL JUNCTION BOX HAVING THE BUS BAR

(75) Inventors: Suguru Sakai, Makinohara (JP); Yoshihito Imaizumi, Makinohara (JP); Hiroaki Takahashi, Makinohara (JP); Ryouta Ando, Makinohara (JP)

(73) Assignee: Yazaki Corporation, Tokyo (JP)

( * ) Notice: Subject to any disclaimer, the term of this patent is extended or adjusted under 35 U.S.C. 154(b) by 14 days.

(21) Appl. No.: 13/537,866

(22) Filed: Jun. 29, 2012

(65) Prior Publication Data

US 2013/0000971 A1    Jan. 3, 2013

(30) Foreign Application Priority Data

Jun. 30, 2011    (JP) ................................. 2011-145661

(51) Int. Cl.
*H02G 5/00* (2006.01)
*H02B 1/20* (2006.01)
*H01R 25/16* (2006.01)
*H05K 7/02* (2006.01)
*H01R 13/53* (2006.01)

(52) U.S. Cl.
CPC ........ *H02B 1/20* (2013.01); *H05K 2201/10272* (2013.01); *H01R 25/16* (2013.01); *H05K 7/026* (2013.01); *H01R 13/53* (2013.01)
USPC ..... 174/68.2; 174/72 B; 174/70 B; 174/88 B; 439/212; 439/213; 361/637; 361/611

(58) Field of Classification Search
CPC .......... H02G 5/025; H02G 5/00; H02G 5/02; H02B 1/21; H02B 1/20; H02B 1/00; H05K 2201/10272; H05K 2203/167; H05K 5/00; H05K 7/026; H01R 13/53; H01R 25/16; H01R 11/05; H01R 25/14; H01R 31/085; H01R 9/2675

USPC ..... 174/72 B, 71 B, 88 B, 70 B, 99 B, 129 B, 174/133 B, 149 B, 68.2, 260, 268; 439/212, 439/213, 114, 210, 76.1, 76.2, 949, 55, 66; 361/600, 601, 624, 627, 637, 639, 648, 361/649, 675, 641, 611; 428/583
See application file for complete search history.

(56) References Cited

U.S. PATENT DOCUMENTS 4,570,031 A * 2/1986 Inoue .......................... 174/72 B
(Continued)

FOREIGN PATENT DOCUMENTS

| EP | 2009967 A3 | 12/2008 |
|----|------------|---------|
| JP | 09-045213 A | 2/1997 |

(Continued)

OTHER PUBLICATIONS

Search Report of GB for Application No. GB 1211371.8 dated Nov. 15, 2012.

*Primary Examiner* — Angel R Estrada
(74) *Attorney, Agent, or Firm* — Edwards Wildman Palmer LLP

(57) ABSTRACT

A bus bar attached to a box main body of an electrical junction box includes: a first terminal portion 11; a second terminal portion 12; and a coupling portion 13 coupling the first and second terminal portions, and made of a plate metal member 10. The plate metal member 10 includes: a first corresponding portion 21 corresponding to the first terminal portion 11; a second corresponding portion 22 corresponding to the second terminal portion 12 and provided parallel to the first corresponding portion 21 with a gap; and a coupling corresponding portion 23 corresponding to the coupling portion 13. The coupling corresponding portion 23 couples both ends adjacent to each other of the first and second corresponding portions 21, 22.

3 Claims, 4 Drawing Sheets

(56) References Cited

U.S. PATENT DOCUMENTS

| | | | |
|---|---|---|---|
| 5,274,195 A * | 12/1993 | Murphy et al. | 174/268 |
| 5,434,749 A * | 7/1995 | Nakayama | 439/949 |
| 6,433,281 B1 * | 8/2002 | Miyajima et al. | 174/70 B |
| 6,454,588 B1 | 9/2002 | Pickles et al. | |
| 6,493,234 B2 * | 12/2002 | Sunami et al. | 174/260 |
| 6,607,115 B2 * | 8/2003 | Kobayashi et al. | 439/76.2 |
| 7,332,673 B2 * | 2/2008 | Shimoda et al. | 174/68.2 |
| 7,580,247 B1 * | 8/2009 | Pearson et al. | 174/149 B |
| 7,611,798 B2 * | 11/2009 | Yoon et al. | 174/133 B |
| 7,709,737 B2 * | 5/2010 | Keegan et al. | 174/72 B |
| 8,383,940 B2 * | 2/2013 | Yoshida | 174/68.2 |
| 2008/0308292 A1 | 12/2008 | Okushita et al. | |

FOREIGN PATENT DOCUMENTS

| | | |
|---|---|---|
| JP | 2001314020 | 11/2001 |
| JP | 2002281645 | 9/2002 |

* cited by examiner

PLATE METAL MEMBER, BUS BAR, AND ELECTRICAL JUNCTION BOX HAVING THE BUS BAR

CROSS REFERENCE TO RELATED APPLICATIONS

This application is on the basis of Japanese Patent Application No. 2011-145661, the contents of which are hereby incorporated by reference.

BACKGROUND OF THE INVENTION

1. Field of the Invention

The present invention relates to a plate metal member for forming a bus bar of an electrical junction box mounted on a vehicle or the like as a moving object, to the bus bar and to the electrical junction box having the bus bar.

2. Description of the Related Art

Various electronic devices such as a head lamp, a tail lamp, a starter motor, and an air conditioner motor are mounted on a vehicle as a moving object.

A junction block is arranged at a proper position in a vehicle for supplying electric power to the various electronic devices. Various electric circuit units composed of fuses, relays or the like are gathered in the junction block.

Incidentally, because the junction box includes fuses, relays, or bus bars, the junction box is also referred as a fuse block, a relay box, or collectively referred to as an electrical junction box. In this embodiment, the fuse block, the relay box, and the junction block are collectively referred to as the electrical junction box (for example, see Patent Literature 1).

A conventional electrical junction box such as disclosed in Patent Literature 1 includes: a box main body of which top wall electric components such as relay, fuse are mounted on, and of which bottom wall a connector of a wiring harness is mounted on a bus bar 100 (shown in FIGS. 6A and 6B) attached to the box main body, and connecting terminals of the electric component with terminals of the connector of the wiring harness according to a predetermined pattern; an upper cover covering the top wall of the box main body; and a lower cover covering the bottom wall of the box main body. Further, a power cable for supplying electric power from a battery or a generator of a vehicle is attached to the box main body.

In the electrical junction box, electric power from a power source is supplied to the power cable, branched by a cable or the bus bar 100, passed via the fuse and the relay, and then supplied to various electronic devices via electric wires of the wiring harness.

For example, as shown in FIGS. 6A and 6B, the bus bar 100 integrally includes: a first terminal portion 101 connected to the fuse; a second terminal portion 102 connected to the relay; and a coupling portion 103 coupling the first and second terminal portions 101, 102 together.

The first terminal portion 101 integrally includes: a first terminal 104 connected to a terminal of the fuse; and a base portion 105 continued to a base end of the first terminal 104 and extended straight. The first terminal 104 is extended vertically from one edge in a width direction of the base portion 105. Further, both surfaces of the first terminal 104 and the base portion 105 are provided on the same plane.

The coupling portion 103 is formed in a band shape extended straight. The coupling portion 103 is continued to one end of the base portion 105 of the first terminal 104, and a longitudinal direction of the coupling portion 103 is crossed to a longitudinal direction of the base portion 105. According to an example shown in FIGS. 6A and 6B, the coupling portion 103 is extended from the base portion 105 of the first terminal portion 101 to a direction away from both the first terminal portion 101 and the base portion 105. Further, a surface of the coupling portion 103 is provided on the same plane as both surfaces of the first terminal 104 and the base portion 105.

The second terminal portion 102 integrally includes: a plurality of second terminals 106 connected to terminals of the relay and extended parallel to each other; and a base portion 107 continued to base ends of the second terminals 106 and extended straight. The second terminals 106 are extended vertically from one edge in a width direction of the base portion 107 in a same direction as the first terminal 104. Further, both surfaces of the second terminals 106 and the base portion 107 are provided on the same plane. The base portion 107 is continued to an end of the coupling portion 103 away from the first terminal 104, and bent from the coupling portion 103. According to the example shown in FIGS. 6A and 6B, the base portion 107, namely, the second terminal portion 102 is bent substantially 90 degrees from the coupling portion 103.

The above bus bar 100 is made by punching a long metal plate, by providing integrally a first corresponding portion 111 corresponding to the first terminal portion 101, a coupling corresponding portion 113 corresponding to the coupling portion 103, and a second corresponding portion 112 corresponding to the second terminal portion 102, and by bending 90 degrees a plate-shaped plate metal member 110 (shown in FIG. 7) at a boundary between the coupling corresponding portion 113 and the second corresponding portion 112. Namely, in the plate metal member 110, the second corresponding portion 112 is continued to an edge away from the first corresponding portion 111 in a width direction of the coupling corresponding portion 113.

CITATION LIST

Patent Literature

Patent Literature 1: JP, A, H09-45213

SUMMARY OF INVENTION

Technical Problem

In the above plate metal member 110, because the second corresponding portion 112 is continued to an edge away from the first corresponding portion 111 in a width direction of the coupling corresponding portion 113, the first corresponding portion 111 and the second corresponding portion 112 are arranged along a longitudinal direction thereof. Therefore, when punching the plate metal, a portion A (shown by a two-dot chain line in FIG. 7) surrounded by the first corresponding portion 111 and the coupling corresponding portion 113 and a portion B (shown by a two-dot chain line in FIG. 7) surrounded by the second corresponding portion 112 and the coupling corresponding portion 113 are removed. Therefore, these portions A, B are not used in the bus bar 100, and wasteful. Therefore, material yield (also referred to as material utilization ratio) is reduced with respect to the conventional bus bar 100 shown in FIGS. 6A and 6B.

Accordingly, an object of the present invention is to provide a plate metal member, a bus bar, and an electrical junction box having the bus bar able to improve the material yield.

Solution to Problem

For achieving the object, according to a first aspect of the present invention, there is provided a plate metal member for forming a bus bar having a straight first terminal portion, a straight second terminal portion, and a straight coupling portion coupling the first and second terminal portions, said bus bar attached to a box main body of an electrical junction box, said plate metal member including:

a straight first corresponding portion corresponding to the first terminal portion;

a straight second corresponding portion corresponding to the second terminal portion and provided parallel to the first corresponding portion with a gap; and a straight coupling corresponding portion corresponding to the coupling portion and coupling both ends adjacent to each other of the first and second corresponding portions, wherein both surfaces of the first corresponding portion, both surfaces of the second corresponding portion, and both surfaces of the coupling corresponding portion are provided on the same plane.

According to a second aspect of the present invention, there is provided a bus bar attached to a box main body of an electrical junction box including:

a first terminal portion extended straight;

a second terminal portion extended straight; and a coupling portion coupling the first and second terminal portions, wherein the coupling portion is continued to one end of the first terminal portion, and the second terminal portion is continued to an edge near the first terminal portion in a width direction of the coupling portion, and wherein any one of an intermediate portion between the coupling portion and the one end of the first terminal portion and an intermediate portion between the edge of the coupling portion and the second terminal portion is bent.

According to a third aspect of the present invention, there is provided an electrical junction box including:

a box main body; and the bus bar of the second aspect attached to the box main body.

According to the plate metal member of the first aspect of the present invention, the first and second corresponding portions are and provided parallel to each other with a gap, and the coupling corresponding portion couples both ends adjacent to each other of the first and second corresponding portions. Therefore, the second corresponding portion is positioned in a portion surrounded by the first corresponding portion and the coupling corresponding portion.

According to the bus bar of the second aspect of the present invention, because the second terminal portion is continued to an edge of the coupling portion near the first terminal portion, when any one of a bent portion between the coupling portion and the first terminal portion and a bent portion between the coupling portion and the second terminal portion is stretched, the first and the second terminal portions are arranged in their longitudinal direction.

According to the electrical junction box of the third aspect of the present invention, because the electrical junction box includes the bus bar of the second aspect, when a bent portion of the bus bar is stretched, the first and second terminal portions of the bus bar are arranged in their longitudinal direction.

Advantageous Effects of Invention

As explained above, according to the first aspect of the present invention, the second corresponding portion is positioned in a portion surrounded by the first corresponding portion and the coupling corresponding portion. Therefore, the portion surrounded by the first corresponding portion and the coupling corresponding portion is not removed wastefully, and used as the second corresponding portion. Therefore, a wasteful portion of the plate metal member of the present invention is further reduced than the conventional plate metal member, and the material yield is improved.

According to the second aspect of the present invention, when any one of a bent portion between the coupling portion and the first terminal portion and a bent portion between the coupling portion and the second terminal portion is stretched, the first and the second terminal portions are arranged in their longitudinal direction. Therefore, both side portions in a width direction of the terminals are not removed wastefully, and used as a part of the bus bar. Therefore, a wasteful portion of the bus bar of the present invention is further reduced than the conventional bus bar, and the material yield is improved.

According to the third aspect of the present invention, because the electrical junction box includes the bus bar of the second aspect, the material yield of the bus bar is improved.

These and other objects, features, and advantages of the present invention will become more apparent upon reading of the following detailed description along with the accompanied drawings.

DESCRIPTION OF EMBODIMENTS

Figure 1:
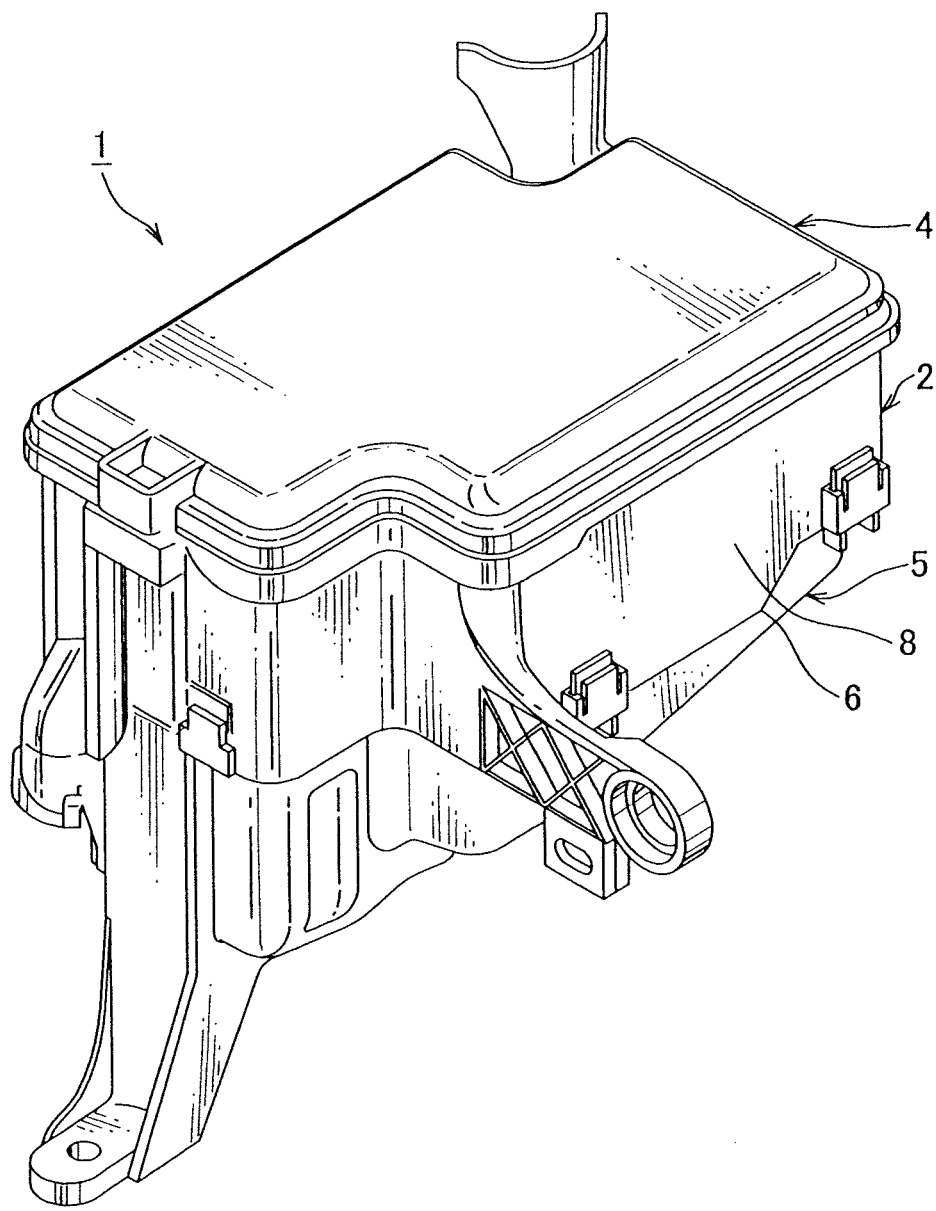
FIG. 1 is a perspective view showing an electrical junction box according to an embodiment of the present invention.

Hereinafter, an electrical junction box according to an embodiment of the present invention will be explained with reference to FIGS. 1 to 5. The electrical junction box 1 shown in FIG. 1 according to this embodiment is mounted on a vehicle as a moving object. As shown in FIG. 1, the electrical junction box 1 includes: a box main body 2; a plurality of bus bars 3 (shown in FIGS. 4A and 4B) attached to a later-described cassette block of the box main body 2; an upper cover 4 covering an upper surface of the box main body 2; and a lower cover 5 covering a lower surface of the box main body 2.

Figure 2:
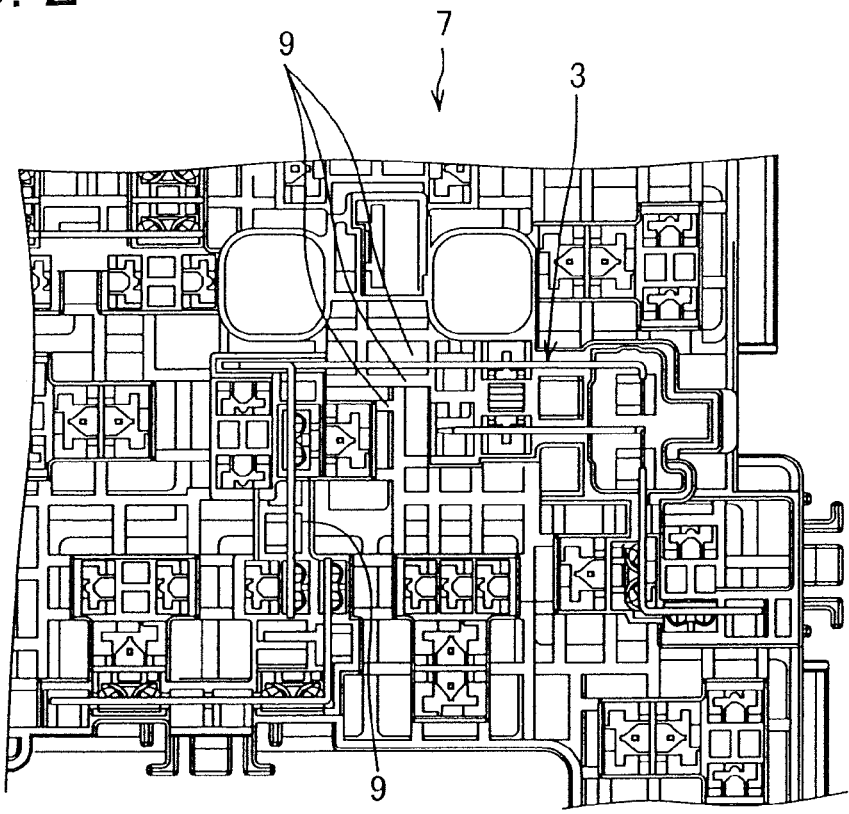
FIG. 2 is a plan view showing a main part of a cassette block of the electrical junction block shown in FIG. 1.
Figure 3:
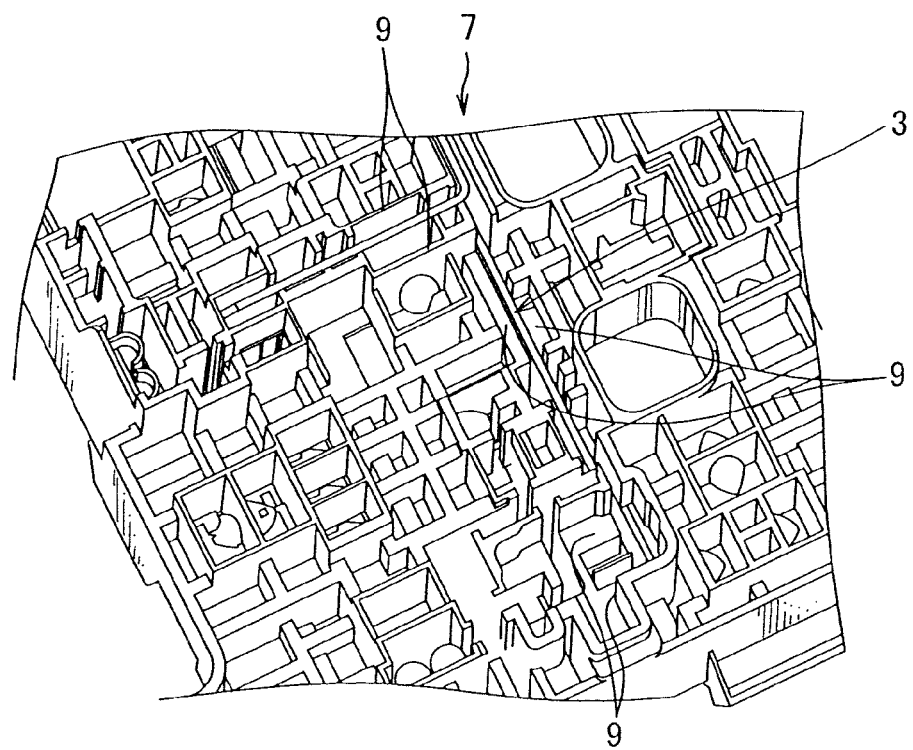
FIG. 3 is a perspective view showing the main part of the cassette block shown in FIG. 2.

The box main body 2 includes: a frame-shaped outer frame 6; and a plurality of cassette blocks 7 (a main part of one cassette block is shown in FIGS. 2 and 3). The outer frame 6 is made of insulating synthetic resin, and molded by well-known injection molding. The outer frame 6 is formed in a tubular shape (frame shape) with a plurality of outer walls 8. An inside of the outer frame 6 is provided with a plurality of attaching holes partitioned by not-shown partition walls. The attaching hole is a space surrounded by outer walls 8 and partition walls composing the outer frame 6. Both ends of the attaching hole are opened. Thereby, the outer frame 6 is formed in a tubular shape (frame shape). Further, not-shown lock-receiving portion for locking the cassette block 7 is provided on an inner wall of the attaching hole of the outer frame 6.

The cassette block 7 is made of insulating synthetic resin, and molded by well-known injection molding. As shown in FIGS. 2 and 3, the cassette block 7 is formed in a box shape allowed to be received in the attaching hole. The cassette block 7 is inserted into the attaching hole via one opening of the attaching hole. As shown in FIGS. 2 and 3, an inner space of the cassette block is partitioned into a plurality of rooms with a plurality of partition walls 9. For example, electric components such as relay, fuse and the like are mounted on an upper surface of the cassette block 7. For example, a connector of a wiring harness routed in a vehicle is mounted on a lower surface of the cassette block 7. Electric wires having the connector at an end of the wiring harness are connected to various electronic devices mounted on a vehicle. Further, the bus bar 3 is received in a space between the partition walls 9 of the cassette block 7.

The above box main body 2 is assembled by receiving the specific cassette block 7 in the attaching hole of the outer frame 6. Then, the above-described electric components are mounted on the upper surface of the cassette block 7 (corresponding to the upper surface of the box main body 2), and the above-described connector of the wiring harness is mounted on the lower surface of the cassette block 7 (corresponding to the lower surface of the box main body 2). Further, a power cable for supplying electric power from a battery or a generator of a vehicle is attached to the box main body 2.

Figure 4A:
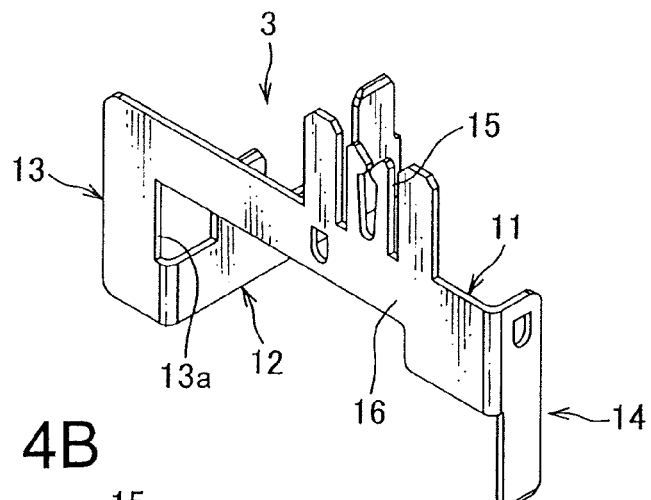
FIG. 4A is a perspective view showing a bus bar of the electrical junction box shown in FIG. 1.
Figure 4B:
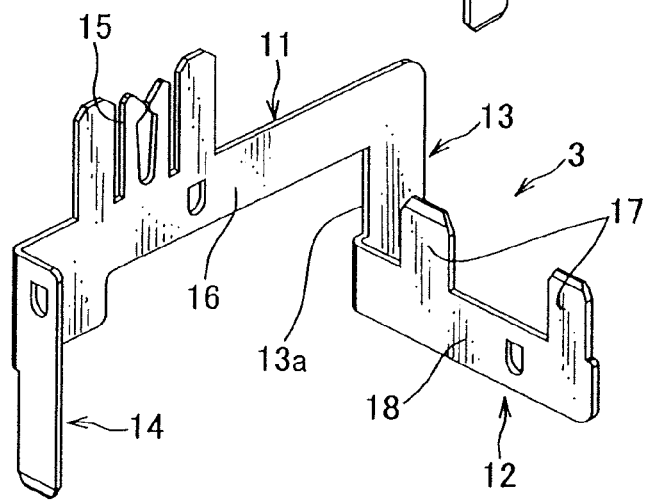
FIG. 4B is a perspective view showing the bus bar of FIG. 4A from a different point of view.
Figure 5:
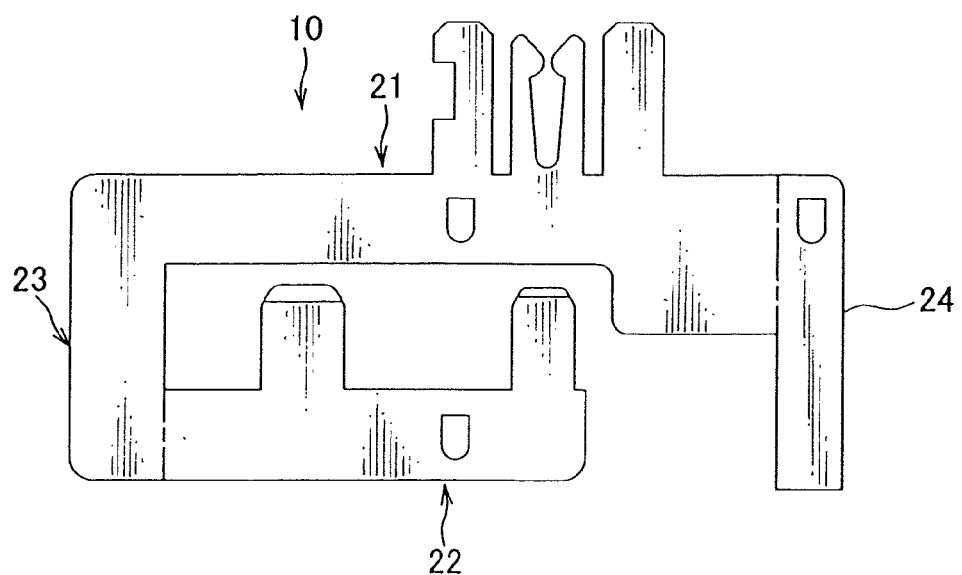
FIG. 5 is a plan view showing a plate metal member for forming the bus bar shown in FIGS. 4A and 4B.
Figure 6A:
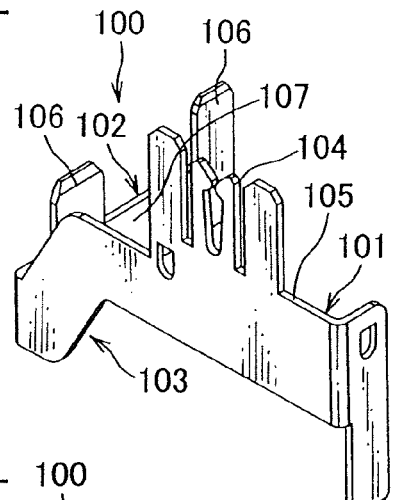
FIG. 6A is a perspective view showing a conventional bus bar.
Figure 6B:
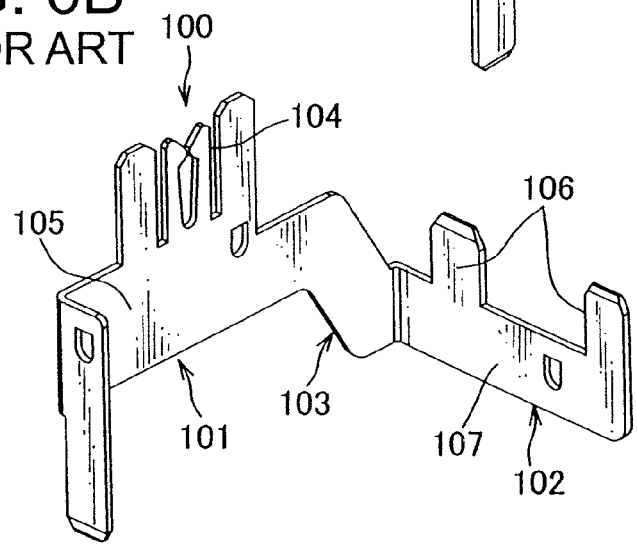
FIG. 6B is a perspective view showing the bus bar shown in FIG. 6A from a different point of view.
Figure 7:
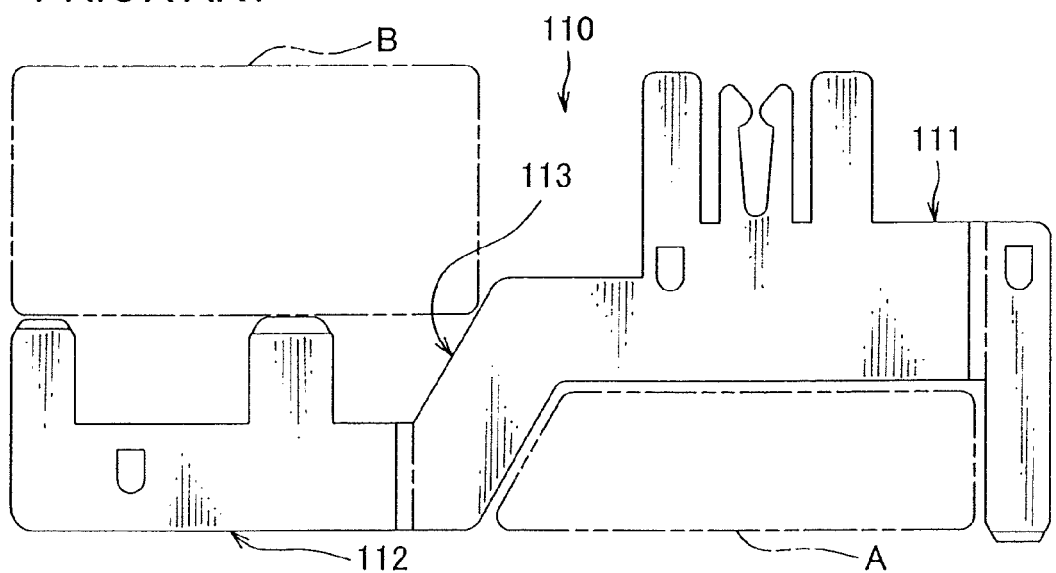
FIG. 7 is a plan view showing a plate metal member for forming the bus bar shown in FIGS. 6A and 6B.

The bus bar 3 (one example is shown in FIGS. 4A and 4B) is made by folding a plate-shaped plate metal member 10 (one example is shown in FIG. 5) made by punching a not-shown long conductive plate metal.

The bus bar 3 shown in FIGS. 4A and 4B integrally includes: a first terminal portion 11 connected to the fuse; a second terminal portion 12 connected to the relay; a coupling portion 13 coupling the first and second terminal portions 11, 12; and a connector connecting portion 14 connected to a terminal of the connector of the wiring harness.

The first terminal portion 11 integrally includes: a first terminal 15 connected to a terminal of the fuse; and a first base portion 16 continued to a base end of the first terminal 15 and extended straight. The first terminal 15 is extended vertically from one edge in a width direction of the first base portion 16. Incidentally, in the embodiment shown in figures, a longitudinal direction of the first terminal 15 is perpendicular to a longitudinal direction of the first base portion 16. Further, both surfaces of the first terminal 15 and first base portion 16 are provided on the same plane. Further, the first terminal portion 11 is formed in a straight shape having the first base portion 16 extended straight.

The coupling portion 13 is formed in a band shape extended straight. One end of the coupling portion 13 is continued to one end of the first base portion 16 of the first terminal portion 11, and a longitudinal direction of the coupling portion 13 is crossed to (in the embodiment shown in figures, perpendicular to) a longitudinal direction of the first base portion 16. In the embodiment shown in the figures, the coupling portion 13 is extended away from the first base portion 16 along the longitudinal direction of the first terminal 15 from the one end of the first base portion 16 of the first terminal portion 11. Further, both surfaces of the coupling portion 13 are provided on the same plane as both surfaces of the first terminal portion 11.

The second terminal portion 12 integrally includes: a plurality of second terminals 17 arranged parallel to each other with a gap and connected to terminals of the relay; and a second base portion 18 continued to base ends of the second terminals 17 and extended straight. The second terminals 17 are extended vertically in the same direction as the first terminal 15 from one edge in a width direction of the second base portion 18. Incidentally, in the embodiment shown in the figures, a longitudinal direction of the second terminals 17 is perpendicular to a longitudinal direction of the second base portion 18. Further, both surfaces of the second terminals 17 are provided on the same plane as both surfaces of the second base portion 18.

The second base portion 18 is continued to an end of the coupling portion 13 away from the first terminal portion 11 and to an edge 13a near the first terminal 15 in a width direction of the coupling portion 13. Further, in the embodiment shown in the figures, a portion between the edge 13a of the coupling portion 13 and the second base portion 18 is bent substantially 90 degrees. Namely, both surfaces of the first terminal portion 11 and the coupling portion 13 are perpendicular to both surfaces of the second terminal portion 12.

The connector connecting portion 14 is formed in a band shape extended straight. One end of the connector connecting portion 14 is continued to the other end of the first base portion 16 of the first terminal portion 11, and a longitudinal direction of the connector connecting portion 14 is crossed to (in the embodiment shown in figures, perpendicular to) a longitudinal direction of the first base portion 16. In the embodiment shown in the figures, the connector connecting portion 14 is extended away from the first base portion 16 along the longitudinal direction of the first terminal 15 from the other end of the first base portion 16 of the first terminal portion 11. Further, in the embodiment shown in the figures, a portion between an edge of the connector connecting portion 14 and the first base portion 16 is bent substantially 90 degrees. Namely, both surfaces of the first terminal portion 11 and the coupling portion 13 are perpendicular to both surfaces of the connector connecting portion 14.

As shown in FIG. 5, the plate metal member 10 for forming the above bus bar 3 integrally includes: a straight first corresponding portion 21 corresponding to the first terminal portion 11; a straight second corresponding portion 22 corresponding to the second terminal portion 12; a straight coupling corresponding portion 23 corresponding to the coupling portion 13; and a straight connector corresponding portion 24 corresponding to the connector connecting portion 14. Both surfaces of the first corresponding portion 21, both surfaces of the second corresponding portion 22, both surfaces of the coupling corresponding portion 23, and both surfaces of the connector corresponding portion 24 are provided on the same plane.

Further, in the plate metal member 10, the first corresponding portion 21 and the second corresponding portion 22 are provided parallel to each other with a gap. Further, the coupling corresponding portion 23 couples the ends adjacent to each other of the first corresponding portion 21 and the second corresponding portion 22. Further, of course, the first corresponding portion 21 is formed in the same shape as the first terminal portion 11, the second corresponding portion 22 is formed in the same shape as the second terminal portion 12, the coupling corresponding portion 23 is formed in the same shape as the coupling portion 13, and the connector corresponding portion 24 is formed in the same shape as the connector connecting portion 14.

The above bus bar 3 is made by folding a boundary between the connector corresponding portion 24 and the first base portion 16 (denoted by a chain line in FIG. 5) and by folding a boundary between the coupling corresponding portion 23 and the second base portion 18 (denoted by a chain line in FIG. 5) of the plate metal member 10 in specific directions. As shown in FIGS. 2 and 3, this bus bar 3 is received in a space provided between the partition walls 9 of the cassette block 7, and attached to the cassette block 7, namely, the box main body 2. When attached to the cassette block 7, namely, the box main body 2, the bus bar 3 electrically connects the power cable and the terminals of the connector of the wiring harness, namely, electric wires with the electric components according to the predetermined pattern.

Both the upper and lower covers are made of insulating synthetic resin, and attached to the box main body 2. The upper cover covers the upper surface of the box main body 2, and the lower cover covers the lower surface of the box main body 2.

The above electrical junction box 1 branches the electric power from the power source supplied via the power cable with the bus bar 3 or the like, and then distributes the electric power to various electronic devices mounted on a vehicle via the fuse, relay, and the electric wires of the wiring harness.

According to this embodiment, the first corresponding portion 21 and the second corresponding portion 22 are provided parallel to each other with a gap, and the coupling corresponding portion 23 couples the ends adjacent to each other of the first corresponding portion 21 and the second corresponding portion 22. Therefore, the second corresponding portion 22 is positioned in a portion surrounded by the first corresponding portion 21 and the coupling corresponding portion 23. Therefore, the portion surrounded by the first corresponding portion 21 and the coupling corresponding portion 23 is not removed wastefully, and used as the second corresponding portion 22. Therefore, a wasteful portion of the plate metal member of the present invention is further reduced than the conventional plate metal member, and the material yield is improved.

Further, because the second base portion 18 of the second terminal portion 12 is continued to an edge of the coupling portion 13 near the first terminal portion 11, when any one of a bent portion between the coupling portion 13 and the first base portion 16, and a bent portion between the coupling portion 13 and the second base portion 18 is stretched, the first and the second terminal portions 11, 12 are arranged in the longitudinal direction of the first and second terminals 15, 17. Therefore, both side portions in a width direction of the first and second terminal portions 11, 12 are not removed wastefully, and used as a part of the bus bar 3. Therefore, a wasteful portion of the bus bar of the present invention is further reduced than the conventional bus bar, and the material yield is improved.

Further, the electrical junction box 1 includes the above bus bar 3, the material yield of the bus bar 3 is improved.

In the above embodiment, a portion between the edge 13a of the coupling portion 13 and the second base portion 18 is bent substantially 90 degrees. However, according to the present invention, a portion between the coupling portion 13 and an end of the first base portion 16 may be bent.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

REFERENCE SIGNS LIST 1 electrical junction box
2 box main body
3 bus bar
10 plate metal member
11 first terminal portion
12 second terminal portion
13 coupling portion
15 first terminal
16 first base portion
17 second terminal
18 second base portion
21 first corresponding portion
22 second corresponding portion
23 coupling portion

What is claimed is:

1. A plate metal member for forming a bus bar having a straight first terminal portion, a straight second terminal portion, and a straight coupling portion coupling the first and second terminal portions, said bus bar attached to a box main body of an electrical junction box, said plate metal member comprising:

a straight first corresponding portion corresponding to the first terminal portion;

a straight second corresponding portion corresponding to the second terminal portion and provided parallel to the first corresponding portion with a gap; and a straight coupling corresponding portion corresponding to the coupling portion and coupling both ends adjacent to each other of the first and second corresponding portions, wherein both surfaces of the first corresponding portion, both surfaces of the second corresponding portion, and both surfaces of the coupling corresponding portion are provided on the same plane, wherein the first terminal portion integrally includes: a first terminal; and a first base portion continued to a base end of the first terminal and extended straight, and wherein the second terminal portion integrally includes: a plurality of second terminals; and a second base portion continued to base ends of the second terminals and extended straight.

2. A bus bar attached to a box main body of an electrical junction box comprising: a first terminal portion extended straight; a second terminal portion extended straight; and a coupling portion coupling the first and second terminal portions, wherein the coupling portion is continued to one end of the first terminal portion, and the second terminal portion is continued to an edge near the first terminal portion in a width direction of the coupling portion, and wherein any one of an intermediate portion between the coupling portion and the one end of the first terminal portion and an intermediate portion between the edge of the coupling portion and the second terminal portion is bent; wherein the first terminal portion integrally includes: a first terminal; and a first base portion continued to a base end of the first terminal and extended straight, and wherein the second terminal portion integrally includes: a plurality of second terminals; and a second base portion continued to base ends of the second terminals and extended straight.

3. An electrical junction box comprising:

a box main body; and the bus bar as claimed in claim 2 attached to the box main body.

* * * * *